United States Patent [19]
Odaka

[11] Patent Number: 4,894,733
[45] Date of Patent: Jan. 16, 1990

[54] TAPE WINDING METHOD AND MACHINE
[75] Inventor: Toshiya Odaka, Tokyo, Japan
[73] Assignee: Otari Electric Company Ltd., Tokyo, Japan
[21] Appl. No.: 168,113
[22] Filed: Mar. 14, 1988
[30] Foreign Application Priority Data
  Mar. 16, 1987 [JP] Japan .................................. 62-61664
[51] Int. Cl.⁴ ...................... G11B 27/36; G01R 33/12
[52] U.S. Cl. ........................................ 360/31; 324/212
[58] Field of Search .......................... 324/212; 360/31; 242/55.1, 201, 27

[56] References Cited
U.S. PATENT DOCUMENTS
2,737,368 5/1966 Newby .................................... 360/31
3,522,525 8/1970 Cottin et al. .......................... 360/31

Primary Examiner—Vincent P. Canney
Attorney, Agent, or Firm—Schwartz & Weinrieb

[57] ABSTRACT

The present invention relates to a tape winding method comprising the steps of inspecting an elongated tape for one or a plurality of positions for defects contained in the tape in a state where the tape is wound onto a tape supply reel prior to being wound into a cartridge; and winding the inspected tape into a cartridge wherein when a part of the tape corresponding to the next reel has any defect, its part is cut out and removed or discarded, and on the other hand when a part of the tape corresponding to the next reel does not have any defect its part is wound into the cartridge, all of such processing being performed by means of a machine or apparatus of the present invention.

6 Claims, 12 Drawing Sheets

TAPE WINDING METHOD AND MACHINE

FIELD OF THE INVENTION

The present invention relates to a tapewinding method and machine for winding magnetic tape into an empty cartridge which is used when magnetic tape cartridges are produced.

BACKGROUND OF THE INVENTION

In the production of a magnetic tape cartridge in which magnetic tape is wound into a cartridge case, a guided end of the magnetic tape is inserted into an empty cartridge which has a reel therein and the magnetic tape is wound onto the reel as a result of rotation of the reel, by which the magnetic tape cartridge is completed.

The aforenoted has hitherto been applied to the production of video tape cartridges and audio tape cartridges. Furthermore, as to the tape winding machine which is used in the aforenoted cartridge production a machine such as that described in Japanese Patent Publication 40071/59(1984) is known. In this machine a long magnetic tape is wound, upon an empty cartridge which is disposed within the machine, by which the winding process is continuously achieved. On the other hand, there is known another type of tape winding machine in which an empty cartridge is not employed, but which is provided with a mechanism for automatically cutting and eliminating the outermost portion of the magnetic tape which is wound onto a supply reel, and disposing of the scrap tape portion as described in Japanese Patent Publication 46904/61(1961).

In the case of the production of video tape cartridges, and audio tape cartridges with the latter type of machine, it is necessary to perform sampling inspection upon the products so that the finished magnetic tape cartridges are not mixed with any defective components.

It is additionally known that, there are instances wherein magnetic tape cartridge products are characterized by defects as a result of which recording and reproduction of information is impossible when the magnetic tape cartridge is employed for the recording of digital signals used in the computer and other similar systems. These defects are mostly generated when magnetic material is coated upon the tape, and exist in specified areas of the tape. However, the magnetic tape cartridge product in which the tape is wound onto the cartridge reel should not contain defects so bad as to prevent its practical use and in particular, such defects should not exist upon those portions of the tape upon which signals are to be recorded and reproduced. The standard of quality is extremely strict because otherwise these defects cause serious interference effects whereby such cartridges cannot favorably compare with conventional video tape cartridges and audio tape cartridges. At present, it should be guarenteed that all products do not contain any defects. The inspection method for determining whether or not any defect is present comprises the method in which signals are actually recorded upon the tape and thereafter reproduced.

However, the aforenoted tape winding method has the disadvantage that magnetic tape cartridges must be individually inspected and is therefore inefficient.

Furthermore, even if an inspection for defects is performed for a long tape which is wound upon a supply reel, and defects in such tape are found, it is impossible with such conventional tape winding machines to remove only those portions of the tape which include the defects and to thereafter retain the good parts of the tape for winding for winding upon the cartridge or supply reel.

The present invention therefore aims at finding a solution to the aforenoted problems.

OBJECTS OF THE INVENTION

An object of the present invention is to provide a tape winding method comprising the steps of : inspecting a tape of long length at one or a plurality of positions for defects contained in the tape while the tape is wound upon a tape supply reel prior to being wound within a cartridge : and winding the insected tape into the cartridge whereby when a part of the tape disposed upon the reel has any defect, its part is removed, and on the other hand when a part of the tape disposed upon the reel does not have any defect, its part is wound within the cartridge.

Furthermore, another object of the present invention is to provide a tape winding machine, for winding tape into a cartridge according to the above tape winding method, comprising a tape supply reel stand on which is loaded a tape supply reel having a tape thereon which has been inspected for the existance of any defect which rotates with the tape supply reel, a running detecting means for detecting running of the tape supplied from the tape supply reel, a cartridge holder for locating and holding the cartridge, a tape take-up reel stand which can support the reel with which the cartridge, held in the cartridge holder, can be engaged so as to rotate with the take-up reel, a scrapping means for removing a portion of the tape containing any defect, a change-over means for selectively changing a guide head of the tape supplied from the tape supply reel and directed toward the cartridge reel or the scrapping means, a setting means for predeterminedely setting the position of the defect contained within the tape disposed upon the tape supply reel, and a control means for controlling timing of the movement of the said change-over means according to the information of the setting means.

SUMMARY OF THE INVENTION

In the tape winding method according to the invention, recording and reproducing of information is initially carried out throughout the length of a long tape wound upon a tape supply reel, and thereafter an inspection of the tape for defects is carried out, by which the defective tape positions are known prior to the winding of the tape into the cartridge. Subsequently, the tape is loaded into the tape winding machine, according to the invention, and the tape is selectively wound while those parts of the tape containing the defects are removed so that the defects are not contained in any part of the tape on which signals are recorded comprising the tape reel of the cartridge. Consequently, the inspection of the tape can be carried out more efficiently than individually inspecting the tapes after they have been wound into their respective cartridges. Furthermore, a waste of tape is avoided in view of the fact that those as parts of the tape containing defects is removed.

In the tape winding machine, the tape reel containing the tape which has been previously inspected for defects, and in which the defective positions or locations have already been noted is loaded upon the tape supply reel stand, and subsequently, the tape is automatically wound within the cartridge. That is, the supply of tape is continuously provided by loading the tape supply reel upon the tape supply reel stand. The present position of the tape supplied from the tape supply reel is monitored by the running detecting means, and an empty cartridge is loaded upon the cartridge holder and is so located that the reel disposed within the cartridge is engaged with the tape take-up reel stand so as to be rotatable thereon. The scrapping means is used for removing all defective portions of the tape, and therefore, any portion of the tape which is not wound within the cartridge. Alternation between winding and scrapping is carried by the change-over means, by which the guide head supplying tape from the tape supply reel is selectively guided either to the cartridge or to the scrapping means. The setting means notes the defective positions of the tape at which defects have been found by inspection of the tape disposed upon the tape supply reel. The control means controls the action of the change-over means on the basis of a comparison of information concerning the present position of the tape as detected by the running detecting means with information concerning the position where defects exist as noted by the setting means. By means of the tape winding machine of the aforenoted construction, winding of the tape can be carried out while those parts of the tape containing defects can be automatically scrapped.

BRIEF DESCRIPTION OF THE DRAWINGS

Various other objects, features, and attendant advantages of the present invention will be more fully appreciated as the same becomes better understood from the following detailed description, when considered in connection with the accompanying drawings, in which like reference characters designate like or corresponding, parts throughout the several views, and wherein.

DETAILED DESCRIPTION OF THE INVENTION

Before an example of the present invention is described, a cartridge suitable for winding a tape therein and upon a tape winding machine illustrated as an example of the present invention will first be described.

Figure 14:
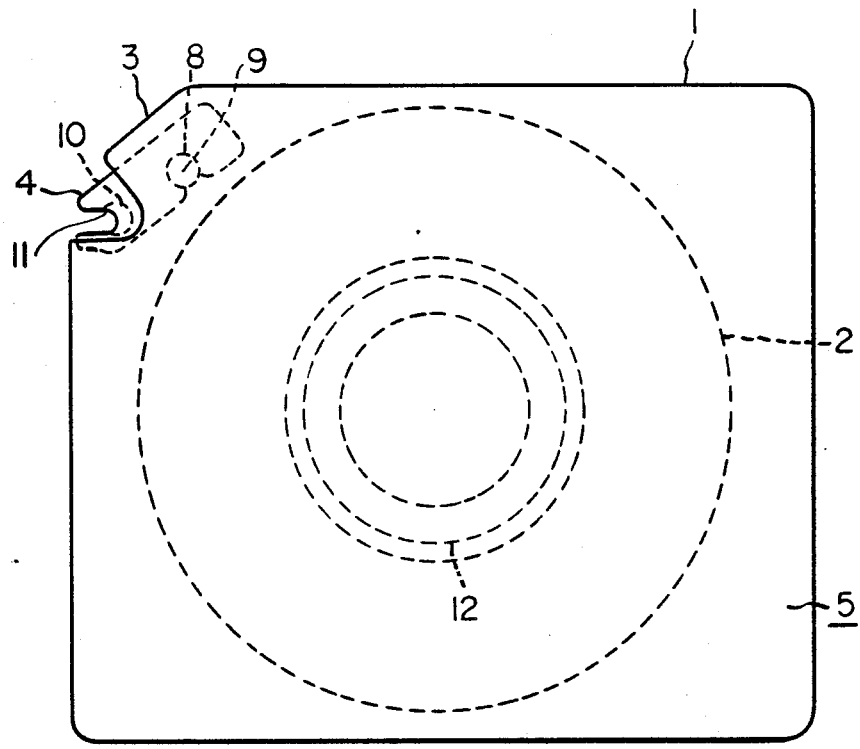
FIG. 14 is a plan for a cartridge suitable for application in the machine shown in FIG. 1.
Figure 15:
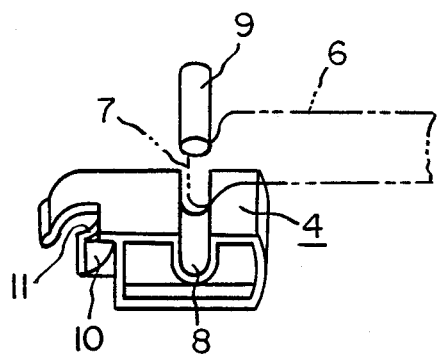
FIG. 15 is a diagram illustrating an important part of said cartridge.

This cartridge is a cartridge for recording and reproducing digital signals as described in Japanese Patent Publication No. 61, 470/61(1986). This cartridge is shown in FIGS. 14, and 15.

A cartridge 5 has a reel 2 within a case 1. The case 1 is generally closed, however it is provided with openings 3 and 12 which are formed within the corner and central positions, respectively of the case 1. The reel 2 can be rotated to a posititon external to side of the case 1 through means of the opening 12. A leader block 4 can be inserted within the opening 3 so that the opening 3 is blocked by the leader block 4. The leader block 4 is seperable from the opening 3 of the case 1. The leader block 4 is provided with two grooves 8 and 11. After tape 6 has been wound within the cartridge 5 by hereinafter-mentioned means, an end 7 of the tape 6 can be retained in the groove 8 by means of a rod 9. The second groove 11 is provided with an enlarged part 10 by which the diameter of a part of the groove 11 is enlarged. The second groove 11 is employed for inserting therein a pin (not shown) for withdrawing the tape 6 by means of the terminal end 7 of the tape 6 which is retained in the groove 8, after the tape 6 has been wound within the cartridge 5, and the winding has been completed. The length of the tape 6 which is actually wound within the cartridge 5 is approximately 170 meters. Once the length of the tape 6 is preset, thereafter the length of the tape 6 is not changed during the winding process.

However, in the tape winding machine of the present invention which will be described more fully hereinafter, the cartridge 5 is supplied in such a condition that the cartridge 5 has the empty reel 2 disposed within the case 1 and the leader block 4 has been inserted within the opening 3. Furthermore, when the tape 6 is retained by means of the leader block 4, the rod 9 should have a length substantially equal to the width of the tape 6. However, the rod 9 is usually supplied to the machine of the present invention in long lengths. Therefore, the rod 9 is cut to a suitable length for use in the machine of the present invention.

Figure 1:
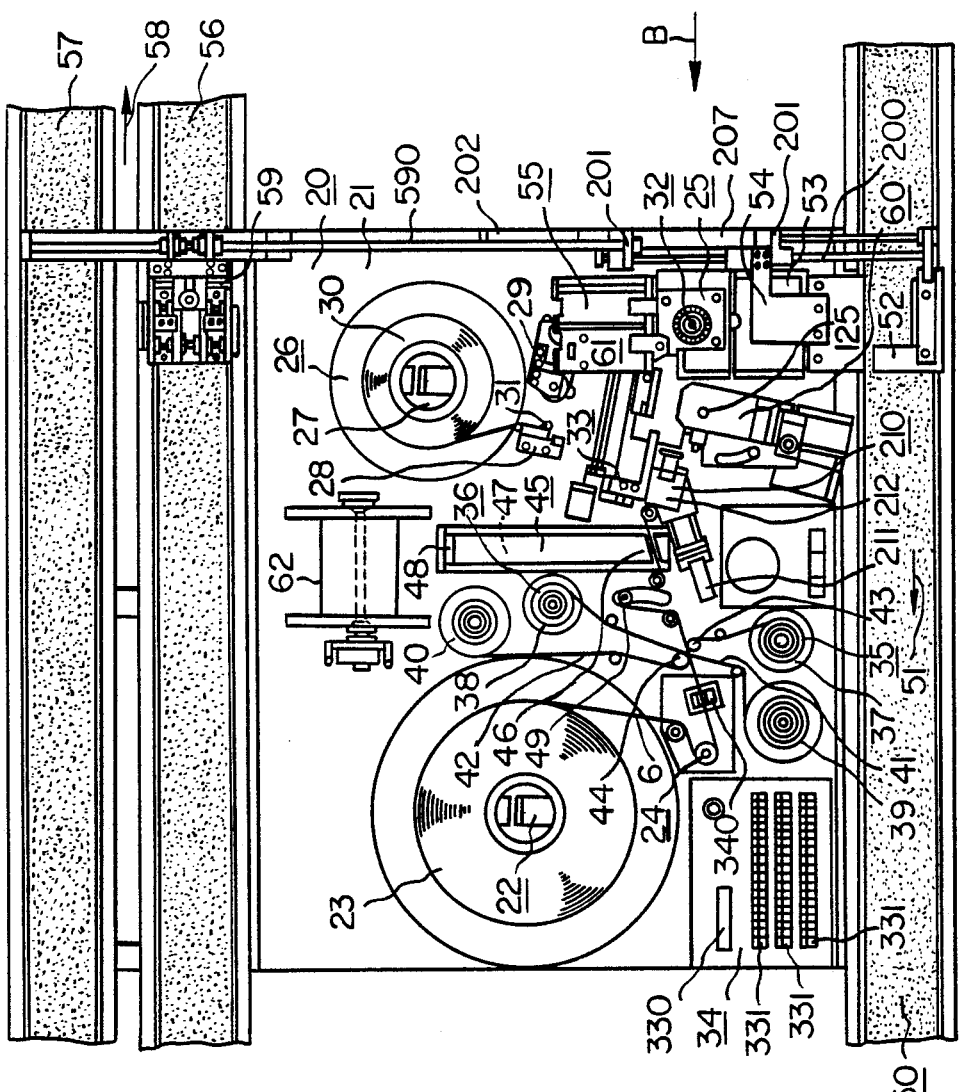
FIG 1 is a plan view illustrating the entire apparatus of the present invention.

FIG. 1 is a plan view of one example of a tape winding machine of the present invention. Respective components of the tape winding machine 20 are attatched to a panel base 21. The panel base 21 is disposed parallel to the surface of a floor.

Numeral 22 designates a tape supply reel stand. The tape supply reel stand is rotated by means of a motor and the like (not shown). A tape supply reel 23, onto which the tape 6 is wound, is loaded on the tape supply reel stand 22. As has been noted hereinabove, the tape 6 which has been wound onto the tape supply reel 23 has been examined prior to being wound thereon. Therefore, the positions of the defects existing on the tape have been noted.

Numeral 24 designates a tachoroller or means for detecting the running speed of the tape 6. The tachoroller 24 is rotated together with the tape 6. Furthermore, the tachoroller is provided coaxially with a means for detecting rotation (not shown). The means for detecting rotation is made up, for example, for a disc having many holes with the same separation therebetween on the circumference and rotating together with the tachoroller as an integral body and a detecting element which optically detects the rotation of the disc.

Numeral 25 designates a cartridge holder. The cartridge holder 25, the construction of which is fully described hereinafter, holds the cartridge 5 shown in FIG. 14, and serves to define the location thereof.

Numeral 26 designates a scrapping means. The scrapping means 26 is made up of a scrapping reel stand 27, a scrapping tape holder 28, a tape splicer 29, and cutter 31. The scrapping reel 27 is rotated by means of a motor (not shown). The scrapping reel 27 rotates a reel 30 of the tape 6 to be scrapped so as to wind the tape 6 supplied from the tape supply reel stand 22 onto reel 30 as occasion demands. An end of the tape 6, the other end of which is connected to the reel 30 can be temporarily held by the scrapping tape holder 28, as will be noted hereinafter. Cutting of the tape 6 held upon the scrapping tape holder 28 is accomplished by means of the cutter 31. Connection of an end of the tape 6 held upon the scrapping tape holder 28 with an end of the tape 6 supplied from the tape supply reel stand 22 is accomplished by means of the splicer 29 with an adhesive tape, as will also be noted hereinafter.

Numeral 32 designates a take-up reel stand. The take-up reel stand 32, the construction of which is fully described hereinafter, rotates the reel 2 of the cartridge 5 which is held upon the cartridge holder 25 and which is disposed within the case 1.

Numeral 33 designates a changeover means. The changeover means 33 selectively guides the leading end of tape 6 supplied from the tape supply reel stand 22 either toward the cartridge 5 or held upon the cartridge holder 25 or toward the scrapping means 26.

Numeral 34 designates a setting means. The setting means 34 sets or records the positions of the defects of the tape 6 wound onto the tape supply reel 23 which is loaded upon the tape supply reel stand 22, as will be noted more fully hereinafter. Numerals 35 and 36 designate tape cleaners. In the tape cleaners 35 and 36, cleaner tapes 41 and 42 are are supplied from supply rolls 37 and 38, and wound onto winding rolls 39 and 40. Cleaner posts 43 and 44 which are arranged at predetermined points of the running paths of the cleaner tapes 41 and 42 cause the cleaner tapes 41 and 42 to come into contact with the opposite surface of the tape 6 whereby cleaning of the tape 6 is performed.

Numeral 45 designates an air column. The air column 45 is provided with an air chamber 47 which has at one end thereof an opening 46. A hole 48 which the air chamber 47 has at the other end thereof can be connected with a negative pressure source (not shown). The tape 6 can therefore be drawn through the opening 46 into the air chamber 47 by means of the created vacuum or negative pressure.

Numeral 49 designates a tension arm. The tension arm 49 detects the tension of the tape 6. The tension detected-by means of the tension arm 49 is a factor to be considered, for example when torque for which the take-up reel stand 32 is driven is controlled and employed in order that the tension of the tape 6 can be maintained.

As the noted hereinabove, after the running of the tape 6 has been detected, The tape 6 supplied from the supply roll stand 22 is cleaned by means of the tape cleaners 35 and 36, the tension of the tape 6 is detected by means of the tension arm 49, and the tape is lead to the changeover means 33 after passing throught the air column 45.

Numeral 50 designates a feed conveyor. The feed conveyor 50 is ordinarily moved in the direction shown by the arrow 51. The cartridge 5 shown in FIG. 14 in its empty condition can be transported by means of the feed conveyor 50 so as to continuously pass by the side of the tape winding machine 20.

Numeral 52 designates a seizing arm. Numeral 53 designates an elevator. As will be noted hereinafter, the seizing arm 52 seizes, as occasion demands, a cartridge 5 which is continuously conveyed by means of the supply conveyor 50, and transports the cartridge 5 to the elevator 53.

Numeral 54 designates a loading arm. The loading arm 54, the construction of which is fully described hereinafter feeds the cartridge holder 25.

Numeral 55 designates a waiting table 55. The waiting table 55 houses for a predetermined period of time a cartridge 5 in which the take-up of the tape 6 has been completed and which was sent from the cartridge holder 25, and serves to locate the cartridge 5.

Numerals 56 and 57 designate delivery conveyors. The delivery conveyors 56 and 57 are ordinarily moved in the direction shown by the arrow 58.

Numeral 59 designates a cartridge carrier. The cartridge carrier 59 moves back and forth between the waiting table 55 and the delivery conveyors 56 or 57. A cartridge carrier 59 transports the cartridge 5 located on the waiting table 55 to the delivery conveyors 56 or 57. However it is possible to properly or selectively use the delivery conveyors 56 and 57 so that a cartridge 5 in which the take-up of the tape has been normally completed is transported by one of the delivery conveyors 56 and 57, for example, the delivery conveyor 56 while a cartridge 5 in which an abnormality has been recognized during the transportation operation is transported by means of the delivery conveyor 57.

Numeral 60 is a retaining block. Numeral 61 designates a retaining base. The constructions of the retaining block 60 and the retaining base 61 are fully described hereinafter. The leader block 4 shown in FIG. 15 can be held by means of the retaining base 11, and can be located against the retaining block 60. In the retaining block 60, an end of the tape 6 is retained within the leader block 4 by means of the retaining rod 9 shown in FIG. 15.

Numeral 62 designates a retaining rod supply staition. The retaining rod 9 shown in FIG. 15 is disposed within the retaining supply staition 62 and the head of the retaining rod 9 can be secured within the retaining block 60.

Figure 2:
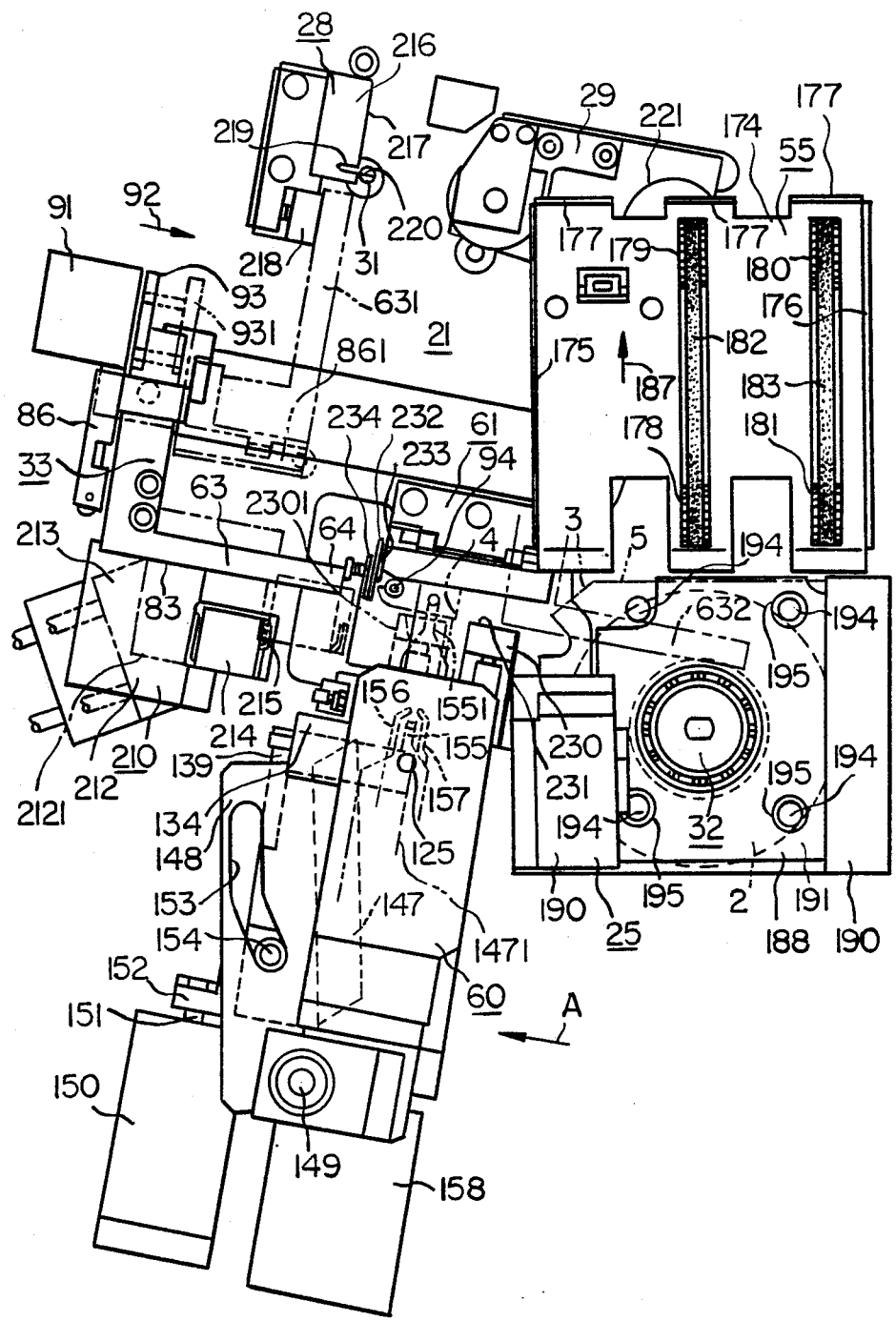
FIG. 2 is an enlarged detailed view of an important part of the apparatus shown in FIG. 1, especially the reel stand 32 and its neighboring components.
Figure 3:
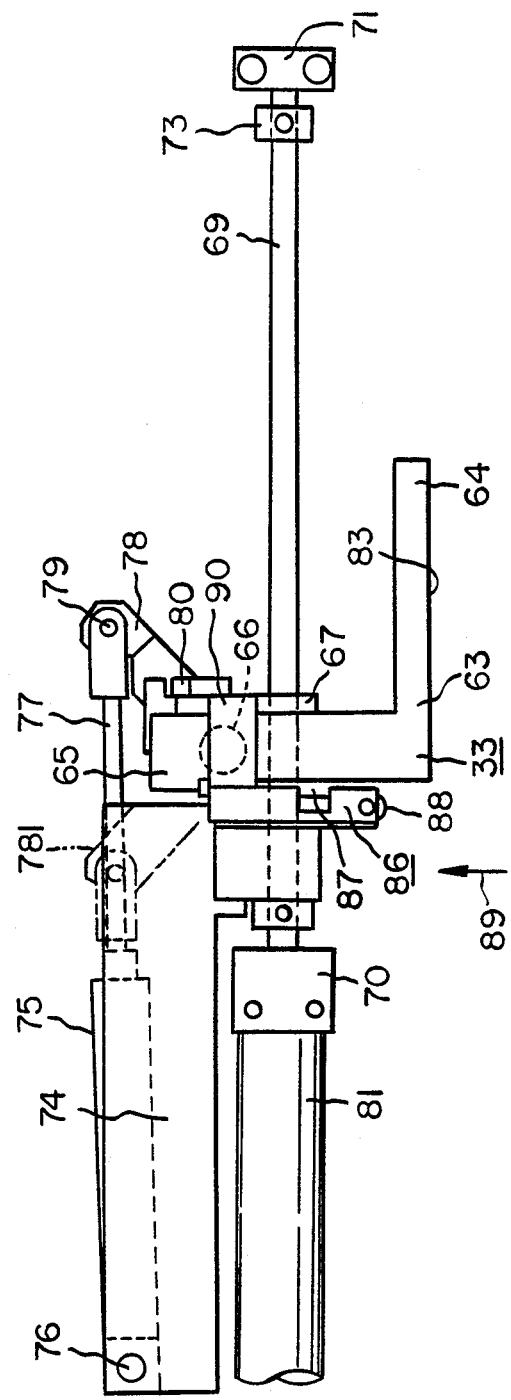
FIG. 3 is a plan view of the construction showing the change-over means.

FIG. 2 is an enlarged plan view of the vicinity of the retaining block 60, and the take-up reel stand 32 of the tape winding machine 20 shown in FIG. 1. FIG. 3 is a plan view showing the detailed construction of the changeover means, and FIG. 4 is a front view of the changeover means.

Figure 4:
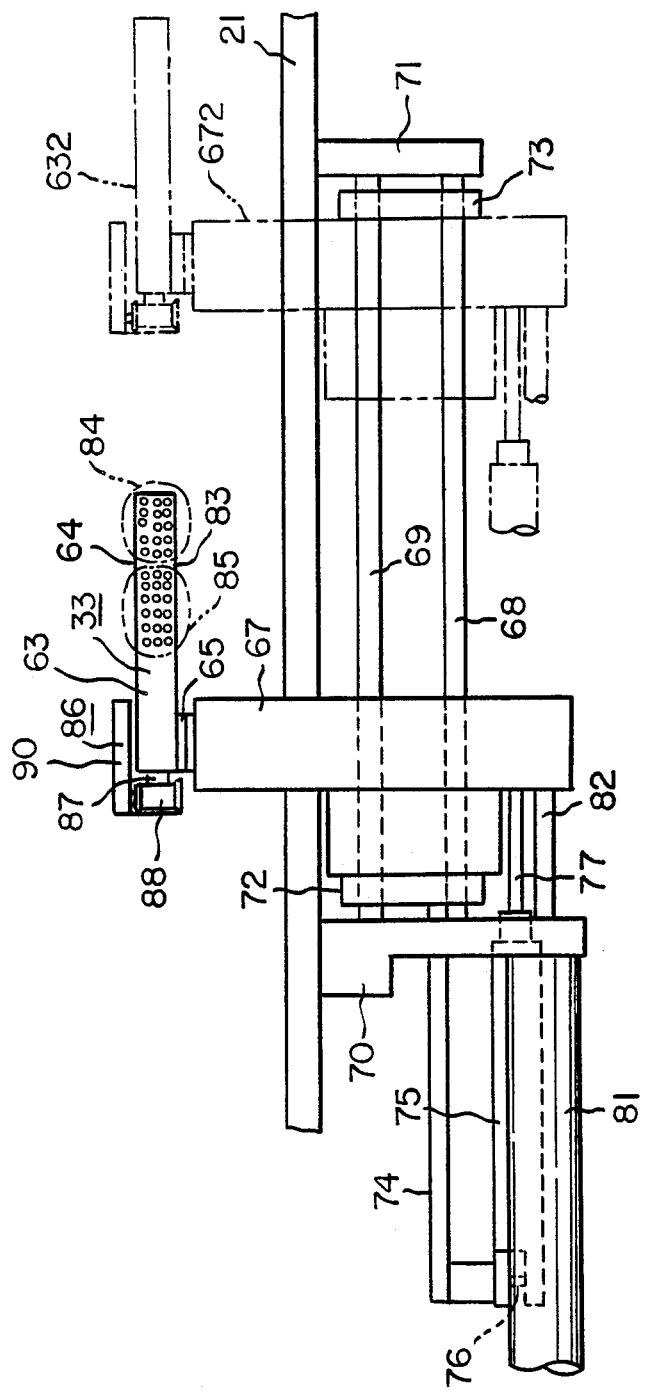
FIG. 4 is a front view of the changeover means.

The following is a description of the construction of the changeover means 33 referring mainly to FIG. 2, FIG. 3, and FIG. 4. The changeover means 33 is provided with a finger 63. The finger 63 has an L-typed form including a thin end 64. The root of the finger 63 is mounted on a rotating block 65, and the rotating block 65 is attatched to a slide block 67 through means of a rotatable shaft 66, so that the finger 63 can rotate about the rotatable shaft 66 relative to the slide block 67.

The slide block 67 is supported upon two parallel slide rods 68 and 69 so as to be slidable thereon. The slide rods 68 and 69 are attached to the panel base 21 through means of supporting blocks 70 and 71 within which both ends of the respective slide rods are disposed, so that the slide block 67 provided with the finger 63 can be moved along the slide rods 68 and 69 relative to the panel base 21.

Stoppers 72 and 73 are mounted upon the slide rods 68 and 69. The stoppers 72 and 73 restrict the range through which the slide block 67 can move. Numeral 74 designates a cylinder angle, which is fixed to the slide block 67. Numeral 75 designates a cylinder. An end of the cylinder 75 is attatched to the cylinder angle 74 through means of a pin 76. The head of the rod of the cylinder 75 is connected with a turning arm 78 through means of a rotatable shaft 79. The turning arm 78 is coaxially mounted on the rotatable shaft 66 whereby the finger 63 is turned by the movement of the cylinder 75.

Numeral 80 shown in FIG. 3 designates a stopper block. The stopper block 80 is mounted upon the slide block 67 so as to restrict the range through which the finger 63 can turn. The range through which the finger 63 can turn is about 90° as illustrated with finger 63 and a finger 631 shown in FIG. 2. The turning arm 78 shown in FIG. 3 travels to the position designated by 781 when the finger 63 travels to the position designated by 631.

As shown in FIG. 4 a cylinder 81 is mounted upon the supporting block 70.

A rod 82 of the cylinder 81 is connected with the slide block 67. As a result thereof, the slide block 67 can travel from the position designated by 67 to the position designated by 672 when the cylinder rod 82 moves. Herein the finger 63 also travels to the position designated by 632 together with the movement of the slide block 67.

A surface of the end 64 of the finger 63 is provided with a first group of small holes 84 and a second group of small holes 85, each of the first and second groups being made up of many small holes. The first and second groups of small holes 84 and 85 are independent with respect to each other That is, the first group of small holes 84 is connected with a negative pressure source (not shown) as occasion demands, while the second group of small holes 85 is, independently of the first group of small holes, connected with a negative pressure source or positive pressure sources as occasion demands.

The surface 83 in which these groups of small holes 84 and 85 are formed is a surface upon which the tape 6 passes, and when running of the tape 6 stops, the tape 6 is attracted to and fixed upon the surface 83 under a state of suction which is formed when the negative pressure source is connected with the groups of small holes 84 or 85.

Furthermore, numeral 86 shown in FIGS. 3 and 4 designates a slide roller. The slide roller 86 is attatched to the finger 63 through means of a slide base 87 so as to be able to slide relative thereto. An end of the slide roller 86 is mounted upon a head roller 88 by means of which the tape 6 can be guided. Furthermore, an angle iron 90 is mounted upon the other end of the slide roller 86. The slide roller 86 is ordinarily spring-loaded by means of a spring (not shown) in the direction of an arrow 89 shown in FIG. 3. Therefore, when the slide roller 86 is pushed in the direction of the arrow 89, the slide roller 86 can be moved toward the surface 83 of the finger 63, and can be turned with the finger 63, as a single body.

In FIG. 2, numeral 91 shown within the vicinity of the change-over means 33 designates a push-type actuator. The actuator 91 is mounted upon a panel base 21. Furthermore, the actuator 91 is provided with a traveling block 93 which can advance in the direction of an arrow 92. The actuator 91 is driven for example by means of pressurized air, and the operation of the actuator 91 causes the travelling block 93 to travel to the position designated by numeral 931 shown in FIG. 2. Herein, when the finger 63 of the changeover means 33 is pivoted and located at the position designated by 631 in FIG. 2, the angle iron 90 of the slide roller 86 is moved by means of the travelling block 93. The slide roller 86 guides the tape 6 upon the surface 83 of the finger 63 at the position shown by numeral 861 shown in FIG. 2.

In FIG. 2 numeral 230 designates a tape supporter. The tape supporter 230 can be moved to the position designated by the numeral 2301 shown in FIG. 2 by means of a cylinder (not shown). The tape supporter 230 includes an attractive surface 231. The attractive surface 231 is provided with a group of small holes (not shown) which can be selectively connected with a negative pressure source so that the tape can be attracted to and held upon the attractive surface 231. The attractive surface 231 is located upon the same flat surface or within the same plane as the surface 83 of the finger 63.

Figure 5:
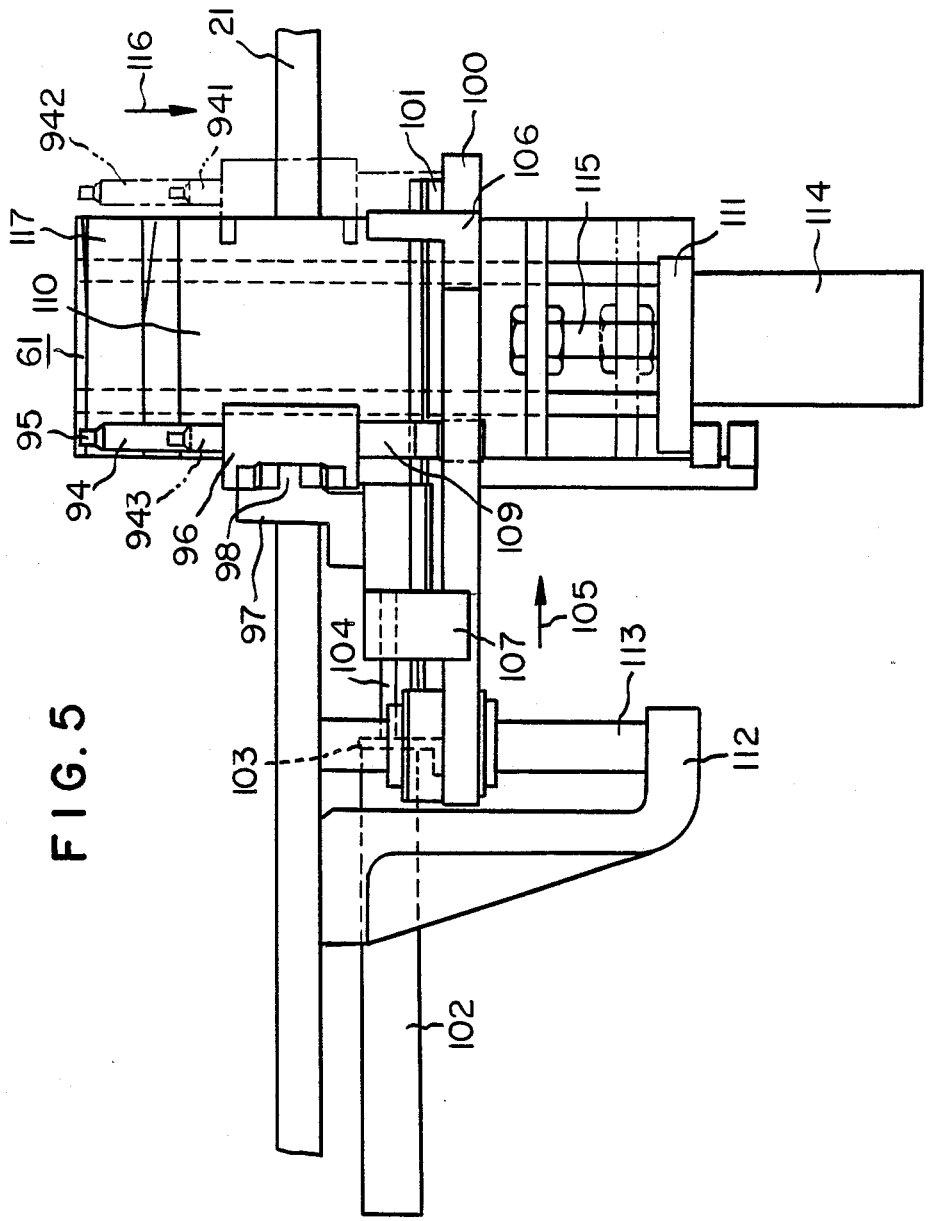
FIG. 5 is a front view of the retaining base 61.
Figure 6:
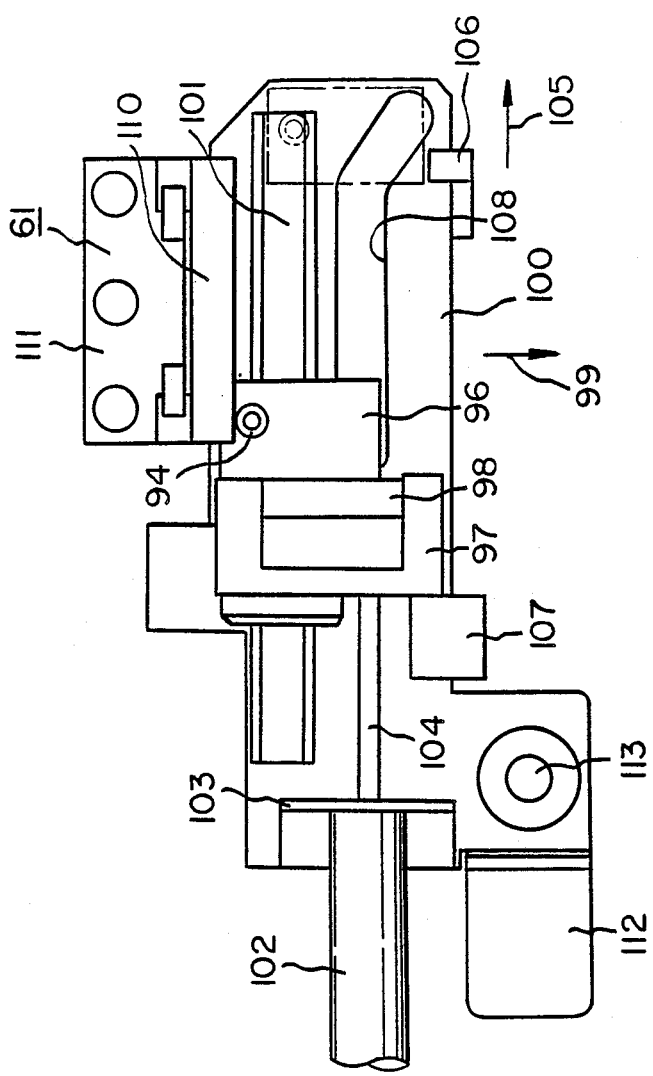
FIG. 6 is a plan view of the retaining base.

The contruction of the retaining base 61 is illustrated in FIGS. 2, 5, and 6. FIG. 5 is an enlarged front view of the retaining base. FIG. 6 is a plan view of the retaining base. Numeral 94 designates a block holding pin. The block holding pin 94 is of a cylindrical form in which a head 95 is of a reduced diameter in such a way that the block holding pin 94 can be disposed within the groove 11 of the leader block 4 so as to engage the leader block 4. The block holding pin 94 is disposed within a slide block 96. The slide block 96 is supported so as to be able to slide upon a rail 98 which is mounted upon a rail block 97. Therefore the block holding pin 94 can be movable in the direction shown by the arrow 99 realtive to the rail block 97, as shown in FIG. 6.

Numeral 100 designates a shifting panel. A rail 101 is attatched to the shifting panel 100. The rail block 97 is supported upon the rail 101 so as to be able to be moved along the rail 101. Numeral 102 designates a cylinder. The cylinder 102 is secured upon the shifting panel 100 by means of an angle iron 103. A rod 104 of the cylinder 102 is connected with the rail block 97. As the result thereof, a rail block 97 can be moved in the direction of an arrow designated by 105 shown in FIG. 5 and the block 97 can be moved as a single body by the movement of the cylinder 102.

Numerals 106 and 107 designate stopper blocks. The stopper blocks 106 and 107 are attatched to the shift panel 100 so as to restrict the range of movement of the rail block 97. Furthermore the shift panel 100 is provided with an elongated slot 108 a part of which bent or inclined at an angle. The slide block 96 is provided with a shaft 109, as shown in FIG. 5. The head of the shaft is formed so as to be inserted into the elongated slot. As a result thereof, the rail block 97 is moved in the direction shown by the arrow 105, the shaft 109 is guided in the elongated slot 108, by which the block holding pin 94 is moved in the direction shown by the arrow 99.

A shift block 110 is mounted upon the shift panel 100. The shift block 110 is movably mounted upon a slide base 111 which is fixed to the panel base 21. Furthermore, the shift panel 100 is slidably supported upon the slide shaft 113 both ends of which are fixed to the panel base 21 through means of an angle iron 112.

Numeral 114 designates a cylinder. The cylinder 114 is fixed to the sliding base 111. The rod 115 of the cylinder 114 is connected to the shift block 110. As a result thereof, when the cylinder rod 115 is moved, the shift panel 100 and shift block 110 can be moved as a single body in the vertical direction shown by the arrow 116.

Furthermore, the shift block 110 is provided with a guide groove 117 for guiding the leader block 4. Referring to FIGS. 2 and 5, the movement of the block holding pin 94 is illustrated. At first the initial position of the block holding pin 94 is the position designated by 941. At this position, as noted hereinafter, when the cartridge 5 is introduced into the cartridge holder 25, the opening 3 provided upon the case 1 of the cartridge 5 is disposed just above the block holding pin 94. The leader block 4 has been inserted into the opening 3. When the block holding pin 94 is moved to the position 942 shown in FIG. 5, the block holding pin 94 is inserted into the groove 11 of the leader block 4, then whent the block holding pin 94 is moved to into the position 943 shown in FIG. 5, the leader block 4 is removed from the opening 3 and is moved to the position shown in FIG. 2 while being guided by means of the guide groove 117 of the shift block 110. However, will be noted hereinafter, after the tape has been wound within the cartridge, the leader block 4 is again returned to the opening 3, by reversing the procedure outlined above. Furthermore, in FIG. 2, numeral 232 designates a cutter. The cutter 232 is mounted upon the shift block 110. The cutter 232 is moved along with the with the shift block 110 as a single body in the vertical direction. The cutter 232 consists of a fixed blade 233 and a moving blade 234 so that the tape 6 can be cut.

Figure 7:
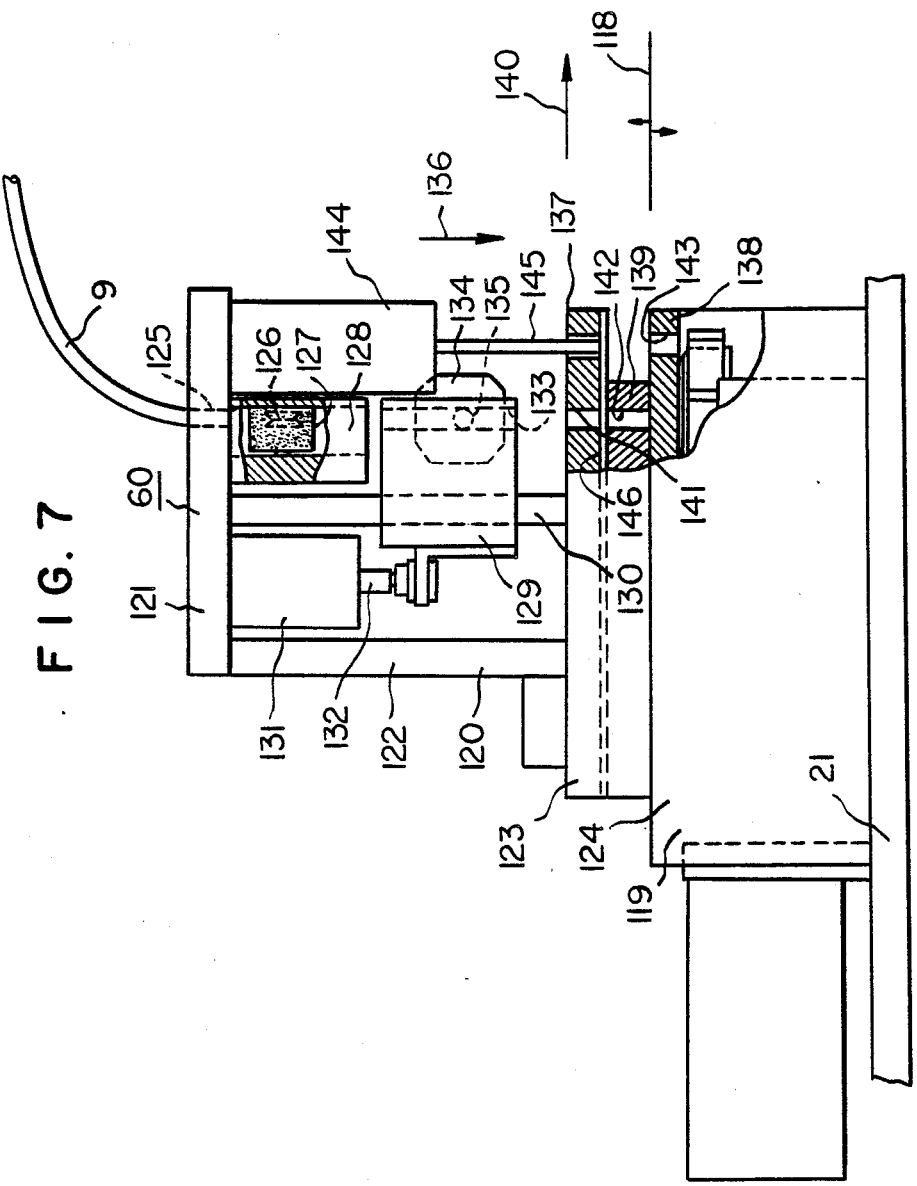
FIG. 7 is a side view of the retaining block 60.

Now, referring to FIGS. 2 and 7 the operation of the apparatus will be described. FIG. 7 is a side view taken in the direction of arrow A in connection with the retaining block 60 shown in FIG. 2.

The retaining block 60 is attatched as a whole to the panel base 21 as shown in FIG. 7. The retaining block 60 consists of a punching part 119 and a cutting part 120 which is mounted thereon.

The retaining rod 9 shown in FIG. 15 is supplied to the cutting part 120 as a long rod is cut into suitable lengths by means of the cutting part 120, and thereafter carried to the punching part 119 and retained together with the tape 6 within the leader block 4 which is located at the retaining block 60 shown in FIG. 2 by means of the punching part 119. An upper plate 121 of the cutting part 120 is attatched to a cutter block 123 by means of a supporting column 122. The cutter block 123 is attatched to a punching block 124.

The upper plate 121 is provided with a through hole 125 for passing the retaining rod 9 therethrough. Numeral 126 designates a guide roller.

Numeral 127 designates a unidirectional roller. The guide roller 126 and the unidirectional roller 127 are attatched to the upper plate 121 through means of a supporting block 126 and the unidirectional roller 127 is located just beneath the through hole 125 so that the retaining rod 9 can pass therethrough. Furthermore, the unidirectional roller 127 is a roller which is heretofore known and is a roller which can rotate in only one direction. Therefore when the retaining rod 9 is inserted into the through hole 125 and passes the unidirectional roller 127 and the guide roller 126, the retaining rod 9 can be moved only in the one direction toward the cutter block 123.

Numeral 129 designates a feed block. The feed block 129 is movably supported upon a shaft 130 the opposite of which are fixed by means of the upper plate 121 and the cutter block 123. Numeral 131 designates a cylinder. The cylinder 131 is attatched to the upper plate 121. A rod 132 of the cylinder 131 is connected with the feed block 129. Furthermore, the feed block 129 is provided with a guide hole 133 which is aligned with the through hole 133 so that the retaining rod 9 can pass through.

Numeral 134 designates a cylinder. The cylinder 134 is attatched to the feed block 129. The rod 135 of the cylinder 134 is formed so as to be able to go directly in and out of the guide hole 133 so that the retaining rod 9 can fixed within hole or slot 133 by being pressed against the wall of the guide hole 133 when the rod 135 is extended into the guide hole 133 in which there is disposed the retaining rod 9. As a result thereof when the cylinder rod 135 is extended the retaining rod 9 is fixed within the feed block 129 and when the cylinder rod 132 is extended and the retaining rod 9 is fixed to the fixed block 129, the retaining rod 9 can be moved along with the feed block 129 in the direction shown by an arrow 136. Then, when the feed block returns to its original position, the cylinder 134 releases the retaining rod 9. However, the retaining rod 9 cannot return due to the disposition of the unidirectional roller 127.

The cutter block 123 is provided with upper and lower guide plates 137 and 138 and a feed plate 139 disposed therebetween. The guide plates 137 and 138 are fixed to panel base 21, and the feed panel can move relative to the guide plates 137 and 138 as designated by the arrow 140, as will be noted more fully hereinafter. The feed plate 139 shown in FIG. 7 shows the position in which the feed plate 139 has been retracted. The feed plate 139 is ordinarily spring-biased in the retraction direction.

The guide plate 137 and the feed plate 139 are provided with through holes 141 and 142 through which the retaining rod 9 can pass and which align with the through hole 125 when the feed plate 139 is disposed at the retracted position. Furthermore, the guide plate 138 is provided with a through hole 143 which aligns with hole 142 when the feed plate is disposed at its advanced position.

Numeral 144 designates a cylinder which is fixed to the upper plate 121. The rod 145 of the cylinder 144 can pass through the holes 142 and 143 when the feed plate 139 is disposed at the advanced position. Furthermore, a cutter groove 146, in which a cutter as will be noted hereinafter can pass, is formed within the undersurface of guide plate 137 so as to be interposed between the guide plate 137 and the feed plate 139.

In FIG. 2, numeral 147 designates a cutter blade mounted within holder 148. The cutter holder 148 is supported upon the panel base 21 by means of a rotating shaft 149 so as to be rotatable about the rotating shaft 149.

Numeral 150 designates a cylinder. The cylinder 150 is attatched to the panel base 21. A rod 151 of the cylinder 150 is connected with a link 152, while the cutter holder 148 is provided with an elongated slot, having a bent portion defined therein 153. The link 152 is provided with a pin 154 which is disposed within the elongated slot 153. As a result thereof, when the cylinder rod 151 is extended the pin 154 travels in a direction parallel to directional extension of rod 151, whereby the cutter holder 148 is pivoted as a result of the interaction between pin 154 and elongated slot 153 by which the cutter blade 147 is led to the position shown by 1471. On the other hand, the link 152 connected with the rod 151 can be advanced further after the pin 154 has been moved while engaging the elongated slot 153, by which the cutter blade 147 has been led by the position shown by 1471, and the feed plate 139 can therefore be advanced by means of the remaining stroke of the rod 151. Therefore, when the cylinder 150 is extended, at first the cutter blade 147 is moved and then the feed plate 139 is moved.

In FIG. 2, numeral 155 designates a punch. A pair of supporters 156, and 157 are arranged on both sides of the punch 155. Both of the supporters 156 and 157 are attatched to the punch 155. Furthermore, supporters 156 and 157 are ordinarily spring-biased by means of a spring (not shown) so as to come close to each other. The retaining rod 9 is adapted to be disposed upon the head of the punch 155 so as to be interposed between the ends of the supporters 156 and 157.

In FIG. 2, numeral 158 designates a cylinder. The cylinder is attatched to the panel base 21. The telescopic rod (not shown) of the cylinder 158 is connected with the punch 155. As a result thereof, when the cylinder rod is extended, the punch 155 can be advanced as a single body with the supporters 156 and 157, and can be led to the position shown by 1551. When the punch 155 is advanced to the position shown by 1551, the leader block 4 is located upon the retaining base 61 in front of the punch 155. Therefore, only when the retaining rod 9 is retained within the leader block 4, can the supporters then be opened. Therefore, the retaining rod is prevented from slipping off the tip of the punch 155 until the retaining rod 9 is retained upon the leader block 4.

Figure 8:
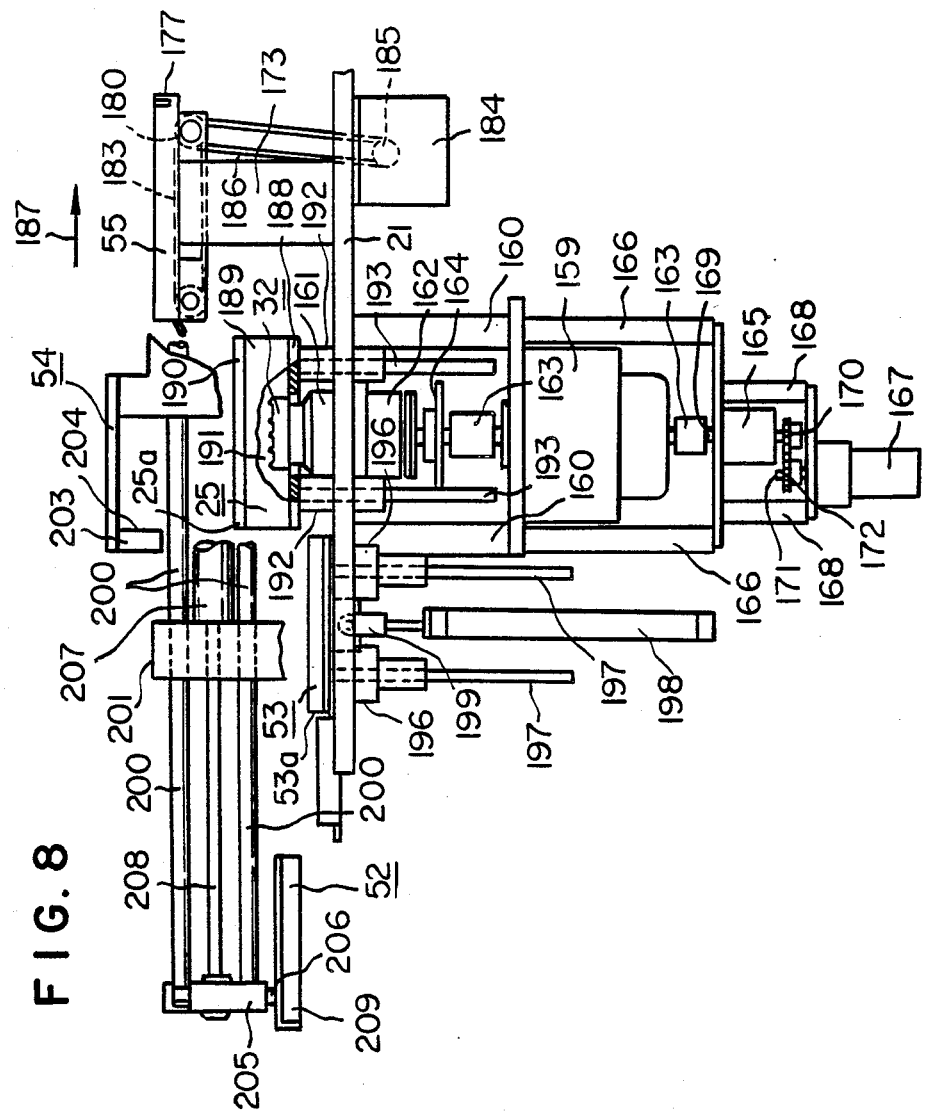
FIG. 8 is a side view of the contruction showing the take-up reel stand 32 and the cartridge holder 25.

Now, referring to FIGS. 1, 2, and 8, the construction of the take-up reel stand 32 and its neighboring components will be described. FIG. 8 is a side view taken in the direction shown by the arrow B in connection with the take-up reel stand 32 shown in FIG. 1. However, a portion of the components is cut away in order that the remaining portion of the components can be clearly shown. Numeral 159 designates a winding motor. The winding motor 159 is mounted upon the panel base 21 by means of a supporting column 160. Numeral 161 designates a bearing. Numeral 162 designates a clutch. The bearing 161 and the clutch 162 are mounted upon the panel base 21. An axle 163 of the take-up or winding motor 159 projects outwardly from both sides of the motor 159, and one end of the axle 163 is connected to the tape take-up reel stand 32 through means of the bearing 161 and the clutch 162 such that these components all rotate together when the clutch 162 interconnects the axle 163 and the bearing reel stand assembly, however the tape take-up reel stand 32 and the motor axle 163 can be separated when the clutch 162 is not operated.

Numeral 164 designates a rotary disc. The rotation of the motor 159 can be detected by detecting the rotation of the rotary disc 164 by means of a suitable detector (not shown). Numeral 165 designates a clutch. The clutch 165 is attatched to the motor 159 through means of a supporting column 166. Numeral 167 designates a gear motor. The gear motor 167 is attatched to the motor 159 through means of a supporting column 168. An axle 169 of the clutch 165 projects outwardly from both ends of the clutch 165 such that one end is connected to the axle 163 of the motor 159, and a gear 170 is attatched to the other end of the axle 169. A gear 172 is mounted upon an axle 171 of a gear motor 167. The gear 170 and the gear 172 are engaged with each other. When the clutch 162 and the clutch 165 are operated, and the motor 159 is not operated, the gear motor 167 can rotate the take-up reel stand 32 through means of the gears 172 and 170. Then the motor 159 and the gear motor 167 can be used so as to selectively rotate the tape take-up reel stand 32 through means of the clutches 165 and 162. Generally speaking, the motor 159 is used for rotating the tape take-up reel stand 32 at a high rate of speed, while the gear motor 167 is used for rotating the tape take-up reel stand 32 at a low rate of speed.

The waiting table 55 shown in FIGS. 2 and 8 is attatched to the panel base 21 through means of a supporting column 173. The waiting 55 is provided with walls which are vertically disposed around a base 174 and upon three sides thereof. The base 174 is provided with belts 182 and 183 both of which are disposed about rollers 178, 179, 180, and 181.

Numeral 184 designates a belt drive motor. The belt drive motor is attatched to the panel base 21. One end of the belt 186 is disposed about an axle 185 of the belt motor 184. The other end of the belt 186 is disposed about the rollers 179 and 180 so that the rollers 179 and 180 can be driven. The belts 182 and 183 are moved by means of the belt motor 184 so that the cartridge 5 disposed upon the waiting table 55 can be moved in the direction shown by the arrow 187. The cartridge 5 disposed upon the waiting 55 is stopped as a result of coming into contact with the end wall 177. Therfore, the cartridge 5 is always exactly located with respect to the wall 177.

As shown in FIG. 8, the cartridge holder 25 is provided with a receiving part 191 which consists of a base part 188, a side plate 189, and a top plate 190. Numeral 192 designates a slide bearing. The slide bearing 192 is mounted upon the panel 21. The cartridge holder 25 is slidably supported upon the slide bearing 192. The cartridge holder 25 can be moved in the vertical direction toward the panel base 21 by means of a cylinder (not shown). FIG. 8 shows the position wherein the cartridge holder 25 has been lowered. However, when the cartridge holder 25 has been raised, the base plate 188 and the base 174 of the waiting table 55 are at the same height.

Numeral 194 as shown in FIG. 2 designates a location pin which is mounted within the panel base 21. The location pin 194 can project slightly from the opening 195 formed in the bottom plate 188 and into the receiving part 191, when the cartridge holder 25 has been lowered, and in this manner, the locating pin 194 comes into contact with the cartridge 5 which is contained within the receiving part 191, by which the location or presence of the cartridge 5 is determined.

In FIG. 8, numeral 196 designates a slide bearing which is mounted within the panel base 21. The elevator 53 is supported within the slide bearing 196 through means of a slide shaft 197. The elevator 53 is capable of receiving the cartridge 5.

Numeral 198 designates a cylinder which is attatched to the panel base 21. A rod of the cylinder 198 is connected to the elevator 53. The elevator 53 can be moved in the vertical direction with respect to the panel base 21 by means of the cylinder 198. FIG. 8 shows the position where the elevator 53 has been lowered, however in a position at which the elevator 53 has been raised, the elevator 53 and the base 174 of the waiting table 55 are at the same height.

The loading arm 54 is slidably supported upon a slide shaft 200. The slide shaft 200 is slidably atttached to the panel base 21 through means of a slide bearing 201.

Numeral 202 shown in FIG. 1 designates a cylinder which is mounted upon the panel base 21. A telescopic rod (not shown) of the cylinder 202 is connected to the location arm 54. The cylinder 202 moves a sliding arm 205 along the slide shaft 200. In FIG. 8, a feed block 203 is atttached to the loading arm 54. A face 204 of the feed block 203 can be pressed against a cartridge 5. Furthermore, the travelling range of the loading arm is defined between the rim 53a of the elevator 53 and the rim 25a of the cartridge holder 25.

The relationship defined between the elevator 53 and, the loading arm 54, the cartridge holder 25, and the waiting table 55 will now be described. Firstly, the loading arm 54 is moved to the edge 53a of the elevator. Then, when the elevator 53 is lowered, a cartridge 5 is deposited upon the elevator 53, and thereafter the elevator 53 is raised. At the raised position, the cartridge holder 25 causes the loading arm 54 to travel to the rim 25a of the cartridge holder 25, at which time the cartridge on the elevator 53 is transferred to the cartridge holder 25. If a cartridge has already been loaded into the cartridge holder, the cartridge 5 within the cartridge holder 25 is pushed by means of the new cartridge 5 disposed upon the elevator 53 so that the cartridge 5 disposed within the cartridge holder 25 is transferred to the waiting table 55.

The seizing arm 52 is provided with a receiving part 209 for receiving a cartridge 5. The seizing arm 52 is mounted upon a telescopic rod 206 of a cylinder 205. The cylinder 205 is mounted upon an end of the slide shaft 200 which is slidably supported upon the panel base 21 by means of the slide bearing 201.

Furthermore, numeral 207 designates a cylinder which is fixed to the panel base 21 and is also atttached to the slide bearing 201. As a result thereof, the seizing arm 52 can be moved in the vertical direction relative to the panel base 21 by means of the action of the cylinder 205, and furthermore can be moved in the transverse direction by means of the action of the cylinder 207.

The travelling range of the seizing arm is the range in which a cartridge 5 supplied by means of the slide conveyor 50 shown in FIG. 1 can be seized.

Furthermore, the transverse travelling range is the range in which a cartridge 5 supplied by means of the supply conveyor 50 can be seized at the left end of the system as shown in FIG. 8 and moved toward the right as viewed in FIG. 8. In FIG. 8, the position of the seizing arm 52 is the position at which it is raised and moved to the left side.

Furthermore, the cartridge carrier 59 shown in FIG. 1 is supported upon a rod 590 both ends of which are secured to the panel base 21. The cartridge carrier 59 can be moved along the rod 590 by means of a motor (not shown). Still further, the cartridge holder can be stopped at a predetermined position as occasion demands.

In FIGS. 1, and 2, numeral 210 is an adhesive supply station. The adhesive supply station is provided with a supplying part 212 which can advance or retract toward the changeover means 33. The supplying part 212 consists of an adhesive pool 213 and an end 215 of an applicator head 214. Adhesive can always be supplied from the pool 213 so as to be extruded. The supplying part 212 is moved to the advanced position shown by 2121. Herein, if the guided head of the tape 6 is held to the applicator head 214, then the adhesive can be supplied to the guided head of the tape 6.

Referring again to FIG. 2, the scrapping tape holder 28 is secured to the panel base 21. The scrapping tape holder is provided with a tape adhesion part 216. The tape adhesion part 216 is provided with a face 217. The face 217 is provided with a group of small holes which can be connected to the negative pressure source (not shown). Numeral 218 designates a receiving finger. The receiving finger 218 can locate the finger 63 so that the face 83 of the finger 63 has a disposition which is substantially the same of that of the surface 631. Furthermore, the tape adhesion part 216 is provided with a cutter groove 219. The cutter 31 is mounted upon the panel base 21, and can be advanced or retracted by means of the action of a cylinder (not shown) relative to the tape adhesion part 216. A cutter blade 220 which is attached to the cutter 31 can pass through the cutter groove 219 when the cutter 31 is moved toward the adhesion part 216. As a result thereof, if the tape 6 is suspended between the tape adhesion part 216 and the finger 63 when the finger 63 is disposed at the position shown 631, and adhered and held on the adhesion part, the tape 6 can be cut at the cutter groove 219. The construction of the tape slicer 29 is well-known. However, briefly an end portion of the tape 6 which is connected to the scrapping reel stand 27 and held upon the tape adhesion part 216, is able to be connected to the guide head of the tape 6 held upon the finger 63, at the adhesion part 216 by means of splicing tape supplied from a reel 221 of splicing tape.

Setting means 34 which is fully described hereinafter with respect to its function, includes an operation switch 331, a dislay 330, and a microprocessor and its accessory components, as shown in FIG. 1.

Figure 9:
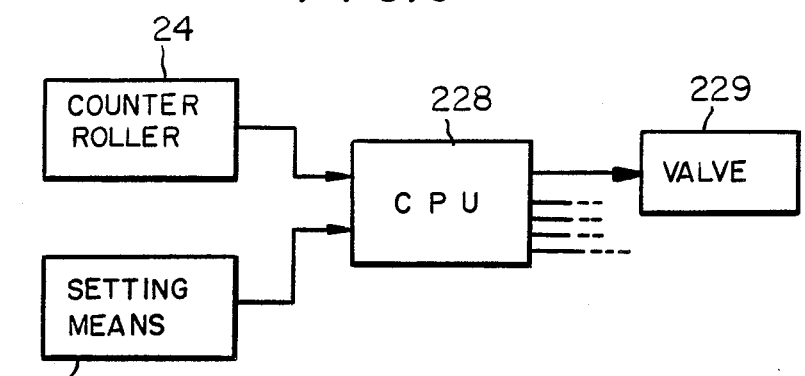
FIG. 9 is a block diagram showing the construction of the control unit of the tape winding machine 20 shown in FIG. 1.

FIG. 9 shows the relationship between the setting means 34 of the tape winding machine 20 shown in FIG. 1 and the running detecting means 24 and the control means 228 for controlling all of the tape winding machine functions. The control means 228 is connected to the running detecting means 24 and the setting means 34. The control means 228 controls various valves 229 and the like, on the of its output signals. Additional input and output control components can be connected to the control means 228, these components being closely related with the control means 228, and the objects to be controlled. However, as such can easily be accomplished with conventionally known techniques and means, a descrition of the same has been ommitted herefrom.

Then a series of actions in the above example are illustrated.

Firstly, an inspection for defects of the tape 6 wound upon the tape supply reel 23 and prior to the winding of the tape 6 by means of the aforenoted tape winding machine will be described.

Figure 13:
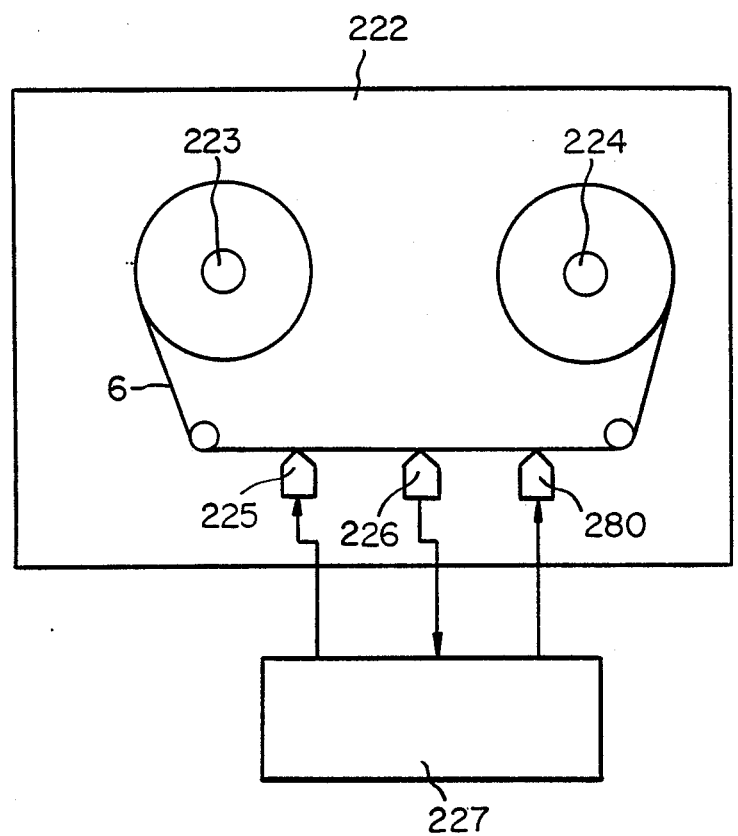
FIG. 13 is a schematic diagram of the apparatus or system for performing an inspection for defects of the tape 6.

FIG. 13 shows the principal of the inspection for defects of the tape and one particular example. An inspection system 222 is provided with a tape supply reel stand 223 and a take-up reel stand 224. The tape 6 is rewound from the tape supply reel stand 223, and run toward the take-up reel stand 224. During the running of the tape 6, writing head 225 and a reading head 226 are arranged along the path so as to come into contact with the tape 6. Numeral 227 designates a control system for the inspection equipment, and is connected with writing head 225 and the reading head 226. In the control unit 227 the test bit pattern for inspection is written upon the tape 6 through means of the writing head 225. Then the written test bit pattern is read out through means of the reading head 226 and a defect inspection operation is conducted. As a result, when defects are found, information concerning the existence of the defects and the positions of the defects upon the tape 6 are outputted. The mode of the above output is for example, a mode in which information concerning the defects and their positions is printed in a serial corresponding to areas in which the full length of the tape has been divided by the length of one cartridge reel.

However, the following description refers to an instance in which the first reel area does not contain any defects, yet the second reel area does contain defects.

The inspected tape supply reel 23 obtained as a result of the foregoing process is loaded upon the tape supply reel stand 22 of the tape winding machine 20 shown in FIG. 1. Then, the positions of the defects upon the tape 6 are input by means of switch 331 of the setting means 34.

The changeover means 33 is initially changed toward the scrapping means 26. The tape 6 is directed toward the scrapping reel stand 27 of the scrapping means 26 through means of the running detecting means 24, the tension arm 49, the air column 45, and the changeover means 33. The retaining rod 9 is loaded within the retaining rod supply part 62. The guided end of the retaining rod 9 is inserted into the through hole of the retaining block 60.

The cartridge 5 shown in FIG. 14 in supplied by being conveyed upon the supply conveyor 50. Herein, the direction of the cartridge is adjusted so that the opening 3 of the cartridge 5 is properly oriented. The cartridge 5 supplied by means of the supply conveyor is caught by means of the seizing arm 52, and sent to the elevator 53. At this time, the elevator is lowered while the cartridge holder 25 is raised. When the elevator 53 is raised while the cartridge is disposed thereon, the cartridge 5 is able to be transferred to the cartridge holder 25 by means of the loading arm 54. As soon as the cartridge 5 is transferred to the cartridge holder 25, the cartridge holder 15 is moved downwardly, and at the same time the elevator 53 is moved downwardly.

The scrapping reel 27 of the scrapping means 26 begins rotating. The tape 6 is unwound through several revolutions from the outermost portion of the tape reel from the tape supply reel 23 and wound onto the scrapping reel. This action is performed for ensuring discarding of the outermost portion of the tape 6. This action is usually referred to as "winding for discarding". After the winding for discarding operation has been completed, running of the tape 6 is stopped while the scrapping tape holder 28 and the changeover means 33 continuously adheres and holds the tape 6. Then a cutter 31 is operated and cutting of the tape 6 is performed.

Then, the changeover means 33 is moved so as to leave the scrapping tape holder 28, and goes to the position shown in FIG. 2. When the finger 63 is disposed at this position, the first and second groups of small holes 84 and 85 shown in FIG. 4 are connected to the negative pressure source, and the tape 6 is adhered and held to the face 83. The guided end of the tape 6 is situated slightly toward the right side of the first group of small holes 84 in FIG. 4. At this position, a comparison of the results of the running detecting means 24 shown in FIG. 9 with the contents of the setting means 34 is performed. In this example, the running detecting means 24 shows that the next wound tape area is a part of the tape corresponding to the first reel does not contain any defects. Therefore, the control means 228 outputs a signal that the area of the tape 6 corresponding to the first reel may be wound, and the following operation is performed.

The cartridge 5 is correctly located with respect to the tape take-up reel stand 32 and within the cartridge holder 25 as shown in FIG. 2. Firstly, the block holding pin 94 is disposed at the position shown by numeral 941 in FIG. 5. However, it is susequently raised to the position shown by numeral 942. That is, the leader block 4 is engaged by means of the block holding pin 94, and then the block holding pin 94 is moved to the position shown by numeral 942 so that the leader block 4 can be located upon the retaining base 61. Thereafter, the block holding pin 94 is moved down to the position shown by numeral 943.

Then, as shown in FIG. 2, the supply part 212 of the adhesive supplying means 210 is moved to the position shown by numeral 2121, and adhesive is coated upon the guided end of the tape 6 retained upon the finger 63. The finger 63 is moved to the position shown by numeral 632 while holding the guided end of the tape 6. Then, the air source connected to the first group of small holes 84 of the finger 63 is changed from a negative pressure source to a high pressure air source, whereby the guided end of the tape 6 is pressed against the reel 2 of the cartridge 5. Then, the high pressure air source and the negative pressure source connected with the first and second groups of small holes 84 and 85 are terminated, whereby the guided end of the tape 6 is released from the finger 63. Then the tape take-up reel stand 32 is slowly rotated in the clockwise direction. When the guided end of the tape 6 is fully wound onto the reel 2, the finger 63 is returned to the position shown by 632 in FIG. 2. Then the take-up reel stand 32 is rotated further with the speed being slowly increased to high speed.

The length of the tape wound onto the reel 2 and the running speed of the tape 6 are always monitored by the running speed detecting means 24. Control of the running speed of the tape 6 is performed by controlling the rotational speed of the tape supply reel stand 22.

Tension of the wound tape 6 is always monitored by the tension arm 49, and controlled by adjusting the torque of the tape take-up reel stand 32. When the proper length of the tape 6 is wound onto the cartridge 5 is detected by the running detecting means 24, the running of the tape 6 is terminated.

When the running of the tape 6 has been stopped, the groups of small holes 84 and 85 of the finger 63 are connected with the negative preesure source, whereby the tape 6 is retained thereon. At the same time, the tape 6 is attracted to and maintained upon the atpe supporter 230 when the latter is connected with the negative pressure source in the position shown by numeral 2301 in FIG. 2. Then the block holding pin 94 is elevated while holding the leader block 4. At the same time, the cutter 232 is moved upwardly. Then the cutter 232 is actuated, and the tape 6 is cut between the finger 63 and the tape supporter 230 which takes the position shown by numeral 2301.

After the tape 6 has been cut, the tape supporter 203 is moved to the position shown by 2301. Herein, the end of the tape 6 which is retained upon the tape supporter 230 takes the position immediately ahead of the leader block 4.

After the retaining rod 9 is cut to the proper length by means of the cutter blade 147 the cut retaining rod 9 is inserted into the punch 155. Thereafter, the retaining rod 9 holds the end of the tape 6 which has been held by means of the tape supporter 230 toward the leader block 4. Then the tape supporter 230 releases the tape 6.

The block holding pin 94 is moved while maintaing its raised position, and the leader block 4 is returned to the opening 3 of the cartridge. Herein the tape take-up reel stand 32 is slowly turned in a clockwise direction so that the tape 6 is prevented from sagging.

Then the block holding pin 94 is moved downwardly, while the cartridge holder 25 is moved upwardly. At this time, a new cartridge is disposed opon the elevator 53. This new cartridge 5 is pushed into the cartridge holder 25, and the cartridge into which the tape has been wound is transferred to the waiting table 55.

The cartridge 5 transferred to the waiting table 55 is sent to the delivery conveyor 56 by means of the cartridge carrier 59.

As noted hereinabove, the winding process is finished.

Then, the detected result obtained by the running dectecting means 24 and the contents set by the setting means 34 are compared by the control means 228. When the second reel is found to have defects as a result of the comparison, the tape 6 is wound toward the scrapping means 26 according to the above discarding winding process.

Figure 10:
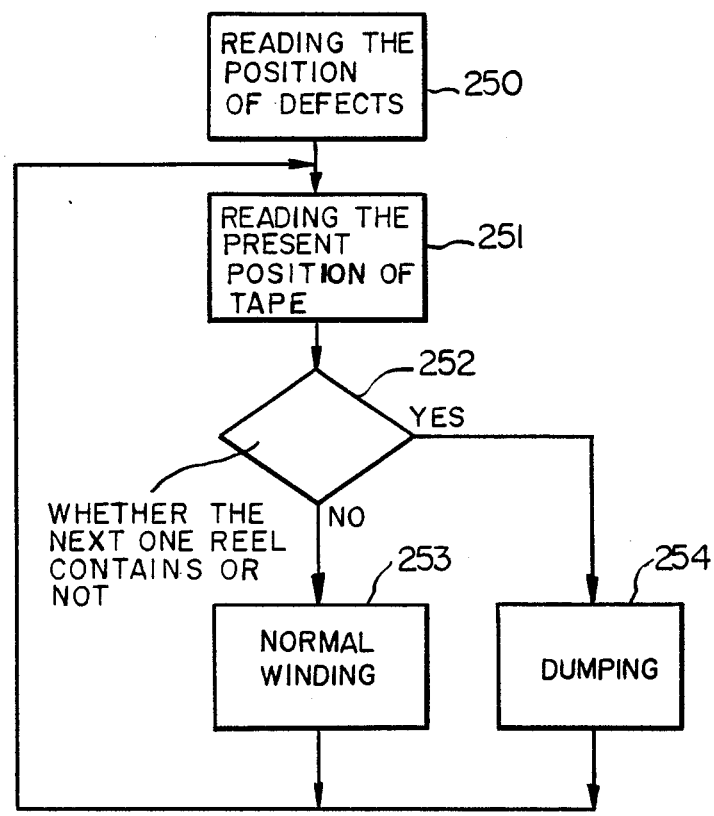
FIG. 10 is a flowchart showing the operation of the control unit illustrated in FIG. 9.

The process of control of the system by means of the control 228 is shown in FIG. 10. At first, the contents set by the setting means 34 is read in step 250. Then the present position of the tape 6 is read by the running detection means 24 in step 251. In step 252, the comparison of the previous steps is performed, that is, a determination is made as to whether or not the next reel to be wound contains defects. If the tape 6 to be wound next is found not to have any defects, then the tape 6 is wound into the cartridge 5 in step 253. If the tape 6 to be wound is found to have defects, then the tape 6 is wound onto the scrapping means in step 254.

There is a case where another modified example other than the above example is suitable according to the circumstances.

At first, there is a modification of the means of outputting the defect inspection results of the tape. In the above example there is illustrated an example in which the positions at which defects exist and are obtained by inspection with the inspecting equipment shown in FIG. 13 is output on the paper. However, the results of the inspection may be output with marks which are readable by machine. Correspondingly, for example, the setting means may comprise an optical reading mechanism, and therefore the positions at which defects exist can be automatically set in the setting means 34.

Furthermore, another writing head 280 can be provided in conjunction with the inspection equipment 222 shown in FIG. 13. That is, the positions at which defects of the tape 6 exist can be written on an end of the tape 6, by means of the writing head. Thus, it becomes possible that information concerning the positions at which defects upon the tape 6 exist is situated at outermost portion of the tape supply reel 23. The recording density of information written by means of the head 280 may not be as high as the recorded information for the inspection of defects. Following such, the tape winding machine is provided with a head 340. Thus, it becomes possible that the positions at which defects of the tape 6 exist can be set in the setting means 34 by loading the tape supply reel 23 on the tape winding machine 20, and by running the tape supply reel 6.

Figure 11:
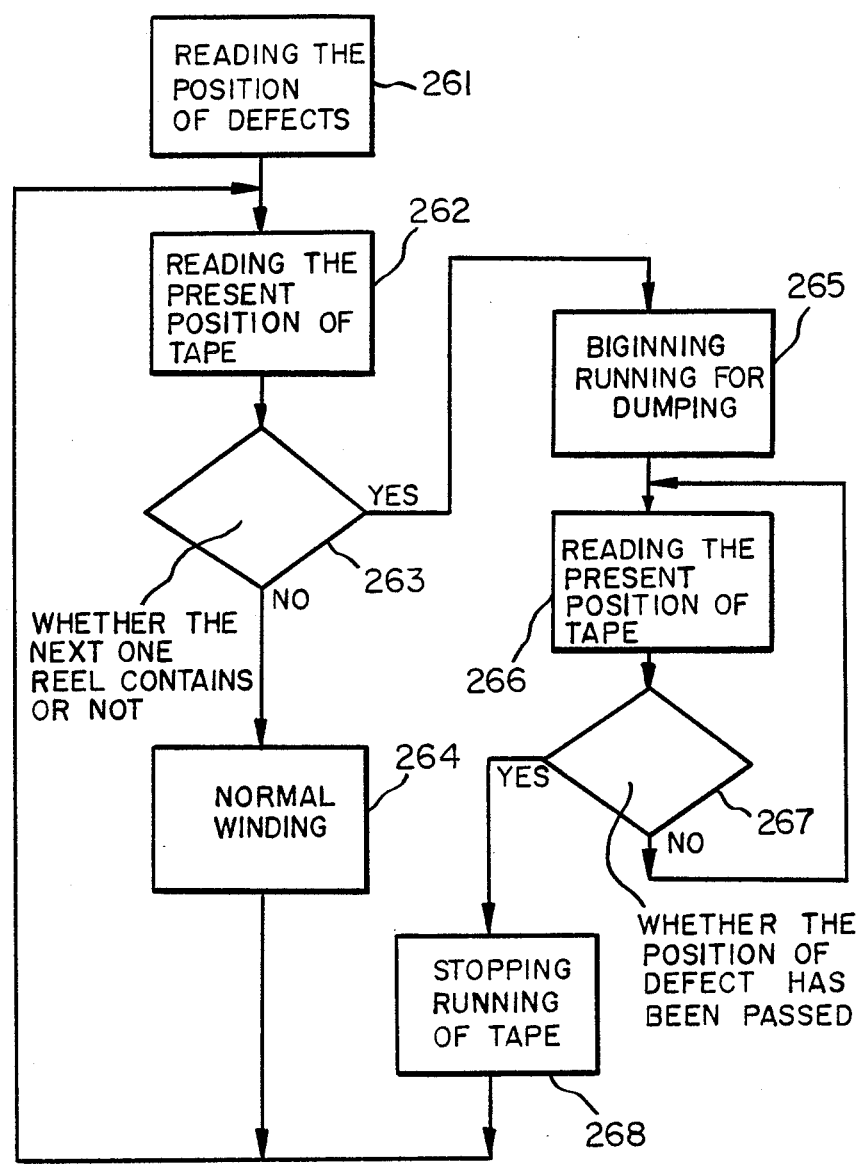
FIG. 11 is a flowchart illustrating the operation of another control unit in the same manner as FIG. 10.

Furthermore, in the above example, the output of the inspection equipment shown in FIG. 13 shows what number of reels contain defects when the tape 6 has been successfully wound from the tape supply reel 23 into the cartridge 5. However, the positions at which the defects exist may be output as the distance between the end of the tape 6 wound onto the tape supply reel 23 and the positions of the defects. In this case, the control unit 228 shown in FIG. 9 controls the tape take-up machine 20 as shown in FIG. 11. At first, the positions of the defects set into the setting means 34 are read in step 261. Then the present position of the tape 6 is read by the running detection means 24 in step 262. Then, whether the next reel contain defects or not is judged from the present position of the tape in step 263. If it is judged that the next reel does not contain any defect, the tape 6 is normally wound into the cartridge in step 264. If it is judged that the next reel contains a defect, the changeover means 33 of the tape winding means 20 is directed toward the scrapping means 26, and running of the tape 6 for scrapping is begun. Furthermore, while the tape 6 is sent toward the scrapping means 26 in step 265, the present position of the tape 6 is always monitored by the running detection means 24. The control means 228 judges whether or not the positions of the defects of the tape 6 through toward the scrapping means 26 in step 267. The control means 228 stops running of the tape 6 in step 268 if it is judged that the positions of the defects of the tape 6 have been sent to the scrapping means 26. Therefore, the length of the scrapped tape 6 can be shortened within the tape winding machine 20.

Figure 12:
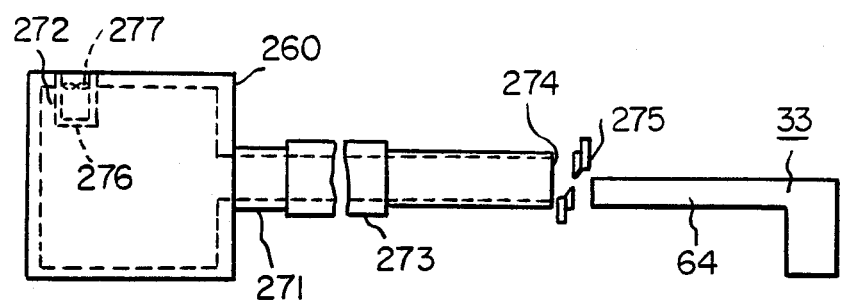
FIG. 12 is a diagram showing the construction of the scrapping means.

Furthermore, as another example, a modification of the scrapping means 26 of the tape winding apparatus 20 will now be descibed. FIG. 12 shows one example thereof. The scrapping means 260 corresponds to the scrapping means 26 shown in FIG. 1. The scrapping means 260 is provided with inlet 271 and outlet 272. A hollow pipe 273 is attatched to the inlet 271. The other end of the pipe 273 is open, and a cutter 275 is provided within the vicinity of the other end 274. A filter 276 and a fan 277 are provided at the outlet 272. Air within the scrapping means is exhausted out through the filter 276 by means of the fan 277. Therefore, air is drawn into the scrapping means 260 from the open end 274. As a result of the above construction, tape 6 is injested into the scrapping means 260. After the scrapping process has been terminated, the tape 6 is cut at the end of the finger 63, and by means of the cutter 275. The process for connecting the tape can be ommitted by means of the scrapping means 260 shown in FIG. 12.

As the tape winding method and machine thereof has been described as above, the production of magnetic tape cartridges can be efficiently performed, because pre-inspection data on defects contained in tape 6 is collected in a state where tape 6 can be wound into each cartridge 5. Furthermore, by means of the tape winding machine according to the invention, the production of magnetic tape cartridges can be performed while the defective portions of the tape are efficiently ommitted.

Obviously, many modifications and variations of the present invention are possible in light of the above teachings. It is therefore to be understood that the present invention may be practice in accordance with the appended claims, otherwise than has been described herein.

I claim:

1. A tape winding method for winding a tape supplied from a tape supply reel into an empty cartridge so that a completed magnetic tape cartridge can be obtained, comprising the steps of:
   inspecting said tape for defects prior to winding said tape into said empty cartridge;
   recording the results of said inspection concerning said defects of said tape; and
   winding portions of said tape not containing any defects into said empty cartridge while those portions of said tape containing defects are discarded based upon said results of said inspection.

2. A method as claimed in claim 1, wherein said step of inspecting for defects within said tape comprises the steps of:
   recording an inspection code upon said tape while running said tape; and
   inspecting said tape for the existence of defects within said tape by reproducing said recorded inspection code and detecting any error in said reproduced signals while running said tape.

3. A method as claimed in claim 1, wherein said step of recording said defects of said tape comprises the steps of:
   storing information concerning said defects of said tape; and
   printing out said stored information concerning said defects of said tape upon a printed medium after inspection of the full length of said tape wound onto said tape supply reel has been completed.

4. A method as claimed in claim 1, wherein said step of recording the results of said inspection comprises the steps of:
   storing information obtained during said step of inspecting said tape for defects; and
   recording said information of said inspection upon said tape before said inspection process of the full length of said tape wound upon said supply reel is completed.

5. A method as claimed in claim 1, wherein said step of winding said portions of said tape not containing any defects into said empty cartridge while said portions of said tape containing defects are discarded on the basis of said inspection results comprises the steps of:
   providing said defect information to a winding machine;
   determining whether said tape should be wound into said empty cartridge or be discarded; and winding said tape into said empty cartridge or discarding said tape on the basis of said determination.

6. A tape winding machine for winding a tape supplied from a tape supply reel into an empty cartridge so that a magnetic tape cartridge can be manufactured, comprising:
   a tape supply reel stand which drives said tape supply reel and said supplied tape;
   a running detecting means for detecting the running of said tape;
   a cartridge holder for locating and holding said empty cartridge;
   a tape take-up means for winding said tape into said empty cartridge held upon said cartridge holder;
   a scrapping means for scrapping or discarding a portion of said tape;
   a changeover means for changing a guided end of said tape supplied from said tape supply reel either toward said take-up winding means or said scrapping means;
   setting means for setting information concerning defects of said tape wound onto said tape supply reel; and
   a control means for controlling said changeover means on the basis of said information set within said setting means and said information of said running detecting means.

* * * * *